United States Patent [19]

Takemae et al.

[11] Patent Number: 4,754,313

[45] Date of Patent: Jun. 28, 1988

[54] SEMICONDUCTOR MEMORY DEVICE HAVING STACKED-CAPACITOR TYPE MEMORY CELLS

[75] Inventors: Yoshihiro Takemae, Tokyo; Tomio Nakano; Masao Nakano, both of Kawasaki; Kimiaki Sato, Tokyo, all of Japan

[73] Assignee: Fujitsu Limited, Kawasaki, Japan

[21] Appl. No.: 93,128

[22] Filed: Sep. 2, 1987

Related U.S. Application Data

[63] Continuation of Ser. No. 727,883, Apr. 26, 1985, abandoned.

[30] Foreign Application Priority Data

Apr. 28, 1984 [JP] Japan .................. 59-086635

[51] Int. Cl.$^4$ .................. H01L 27/02; H01L 29/78; H01L 29/04
[52] U.S. Cl. .................. 357/41; 357/23.6; 357/59
[58] Field of Search .................. 357/23.6, 41, 59 G, 357/59 I, 59 J

[56] References Cited

U.S. PATENT DOCUMENTS

| 4,151,607 | 4/1979 | Koyanagi et al. | 357/23.6 |
| 4,376,983 | 3/1983 | Tsaur et al. | 365/53 |
| 4,475,118 | 10/1984 | Klein et al. | 357/23.6 |

FOREIGN PATENT DOCUMENTS

0112670 7/1984 European Pat. Off. .
0098165 11/1984 European Pat. Off. .

Primary Examiner—Gene M. Munson
Attorney, Agent, or Firm—Staas & Halsey

[57] ABSTRACT

A semiconductor memory device including: a substrate; a plurality of word lines; a plurality of bit lines; and a plurality of memory cells, each positioned at an intersection defined by one of the word lines and one of the bit lines and including a transfer transistor and a capacitor. Each of the memory cells has a first insulating layer covering a gate of the transfer transistor. The capacitor in each memory cell includes a second conductive layer which contacts one of source and drain regions of the transfer transistor in the memory cell, through the first insulating layer, and extends over the gate of the transfer transistor, a second insulating layer formed on the first conductive layer, and a second conductive layer extending over the second insulating layer. The semiconductor memory device further includes an additional conductive layer directly connected to the other of the source and drain regions of the transfer transistor in the memory cell, through the first insulating layer covering same, and extending over the gate of the adjoining transfer transistors. Each bit line is connected to the other of the source and drain regions through the additional conductive layer. A method for manufacturing a semiconductor memory device having the above construction.

9 Claims, 11 Drawing Sheets

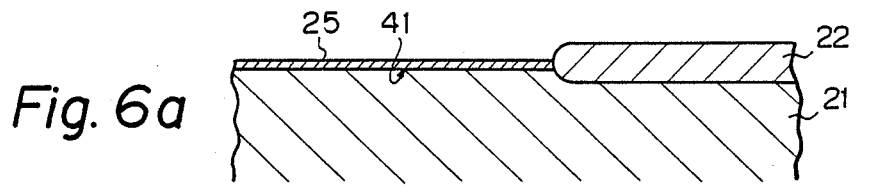
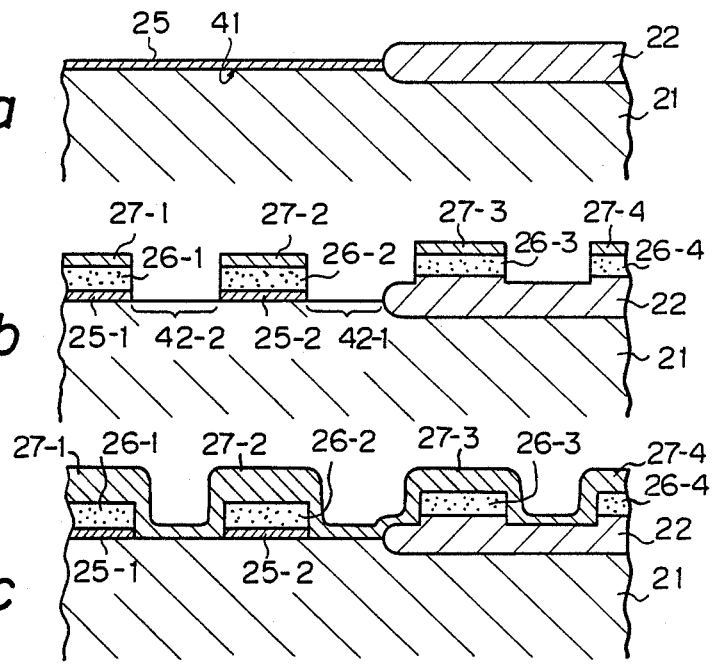
Fig. 6a
Fig. 6b
Fig. 6c
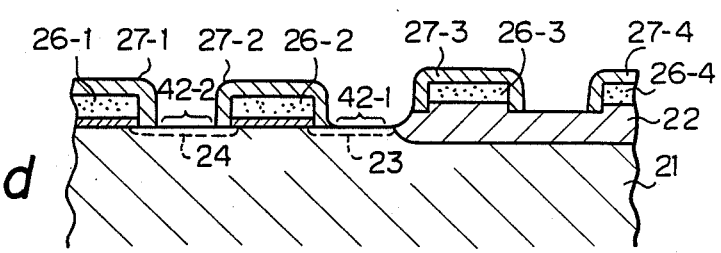
Fig. 6d
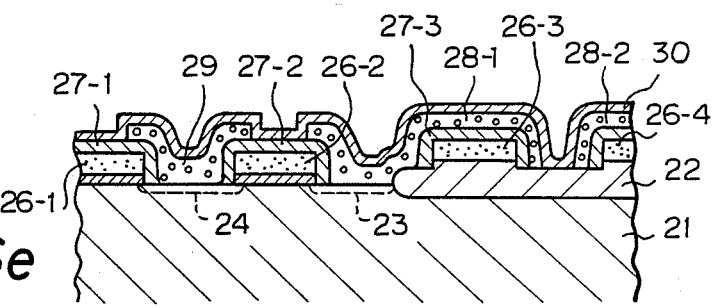
Fig. 6e

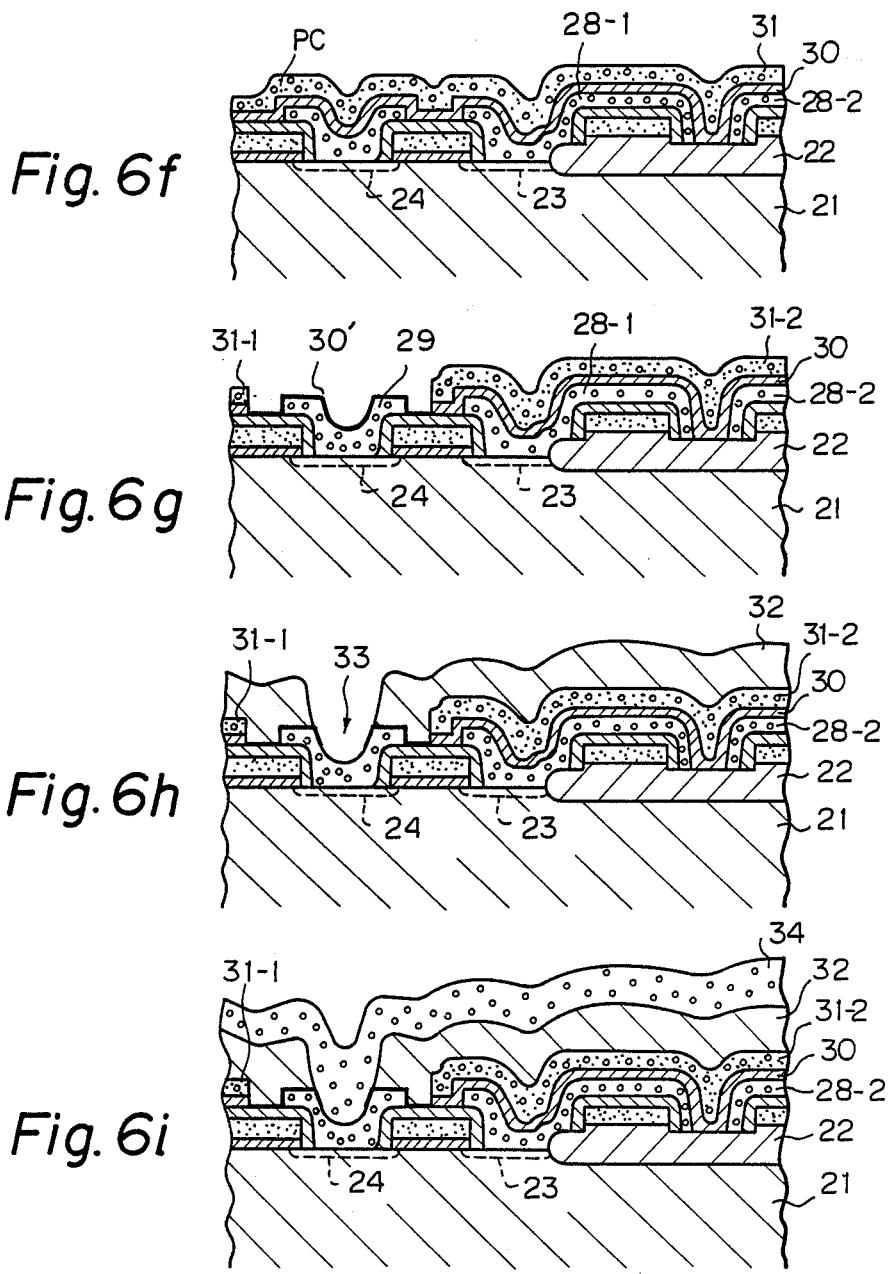

SEMICONDUCTOR MEMORY DEVICE HAVING STACKED-CAPACITOR TYPE MEMORY CELLS

This is a continuation of co-pending application Ser. No. 727,883 filed on Apr. 26, 1985 now abandoned.

BACKGROUND OF THE INVENTION

The present invention relates to a metal-oxide semiconductor (MOS), broadly a metal-insulated semiconductor (MIS) dynamic semiconductor memory device having stacked-capacitor type memory cells.

Recently, MOS memory cells of a one-transistor one-capacitor type have come into use in MOS dynamic memory devices. Fine lithographic technology has been developed so as to reduce the size of the elements of each memory cell, thereby obtaining a large capacity of a highly integrated semiconductor device. However, there is a limit to obtaining a high integration and a large capacity by size reduction only. In addition, size reduction of memory cells increases the generation rate of soft errors and the number of harmful effects due to hot electrons and hot holes.

For improving memory cells of a one-transistor one-capacitor type, stacked-capacitor type memory cells have been proposed (see: Technical Digest of the Institute of Electronics and Communication Engineers of Japan, SSD80-30, 1980, July). Each stacked-capacitor type memory cell includes a transfer transistor, which is the same as that of the conventional memory cell, and a capacitor, which comprises an electrode extending over a thick field-insulating layer, a counter electrode over its own transfer transistor, and an insulating layer therebetween, thereby increasing the capacitance of the capacitor.

Japan Unexamined patent publication (Kokai) No. 55-154762, published on Dec. 2, 1980, discloses a semiconductor memory device having stacked-capacitor type memory cells each of which includes a capacitor, formed by a dielectric layer and two opposing conductive layers on the surfaces thereof placed above a transistor region for increasing the capacitance of the capacitor while maintaining the high integration.

In the prior art, however, there are disadvantages of a low integration, lack of reliability, etc. These disadvantages will be discussed later with reference to a specific example.

SUMMARY OF THE INVENTION

It is an object of the present invention to provide a stacked-capacitor type semiconductor memory device including highly integrated memory cells.

It is another object of the present invention to provide a stacked-capacitor type semiconductor memory device less liable to short-circuits between bit lines and word lines.

It is still another object of the present invention to provide a stacked-capacitor type semiconductor memory device less susceptible to breakage of bit lines.

According to one aspect of the present invention, there is provided a semiconductor memory device including: a substrate; a plurality of word lines; a plurality of bit lines; and a plurality of memory cells, each positioned at an intersection defined by one of the word lines and one of the bit lines and including a transfer transistor and a capacitor. The word lines are formed by a first conductive layer. The transfer transistor in each memory cell has a gate that is connected to one of the word lines and that is formed by the first conductive layer, and source and drain regions. Each of the memory cells has a first insulating layer covering the gate of the transfer transistor. The capacitor in each memory cell includes a second conductive layer which contacts one of the source and drain regions of the transfer transistor in the memory cell through the first insulating layer, and extends over the gate of the transfer transistor, a second insulating layer formed on the second conductive layer, and a third conductive layer, extending over the second insulating layer. The semiconductor memory device further includes an additional conductive layer directly connected to the other of the source and drain regions of the transfer transistor in the memory cell through the first insulating layer covering the gate electrode, and extending over the gate of the adjoining transfer transistors. Each bit line is connected to the other of the source and drain regions through the additional conductive layer.

According to another aspect of the present invention, there is provided a method for manufacturing a semiconductor memory device having the above construction.

BRIEF DESCRIPTION OF THE DRAWINGS

Other objectives and features of the present invention will be described below with reference to the accompanying drawings, in which:

FIGS. 6a to 6i are sectional views explaining the production of the semiconductor memory device shown in FIG. 5;

DESCRIPTION OF THE PREFERRED EMBODIMENTS

Before describing the preferred embodiments of the present invention, an explanation will be given of the prior art for reference.

Figure 1:
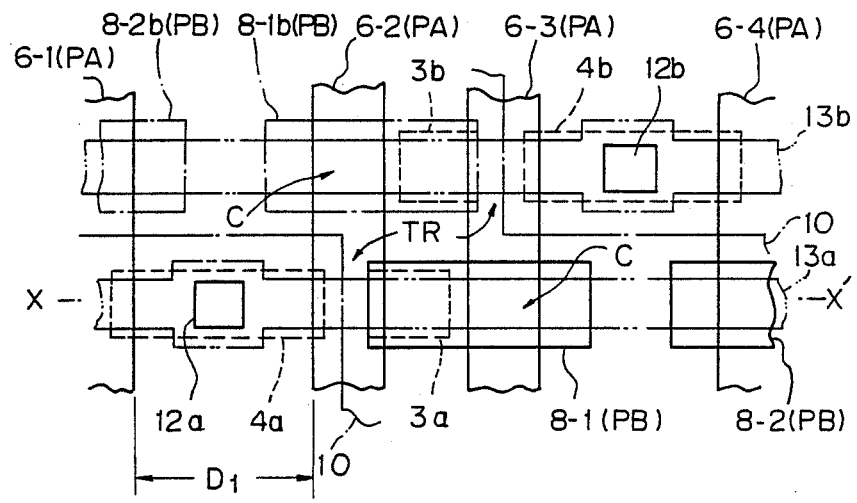
FIG. 1 is a plane view of a prior art semiconductor memory device having stacked-capacitor type memory cells.
Figure 2:
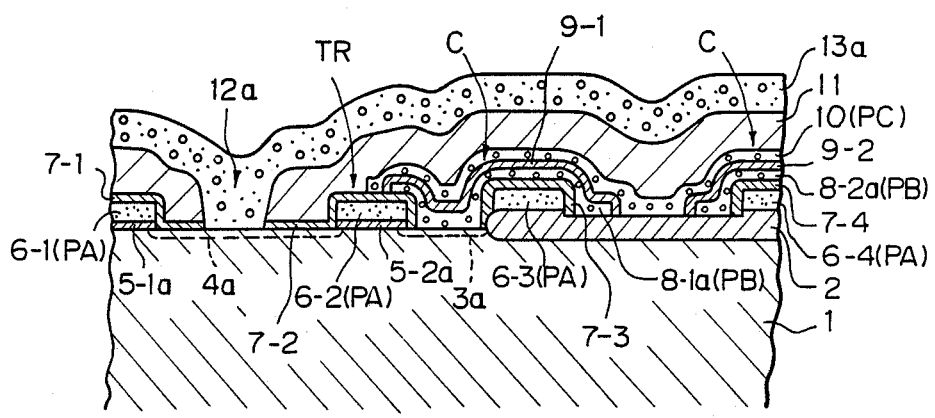
FIG. 2 is a sectional view of the semiconductor memory device shown in FIG. 1, taken along a line X—X'.

FIG. 1 is a plane view of a prior art semiconductor memory device. FIG. 2 is a sectional view of the semiconductor memory device shown in FIG. 1, taken along a line X—X'. The semiconductor memory device is a stacked-capacitor type memory device, more particularly a folded bit-line type semiconductor memory device as shown by the equivalent circuit diagram in FIG. 3.

Figure 3:
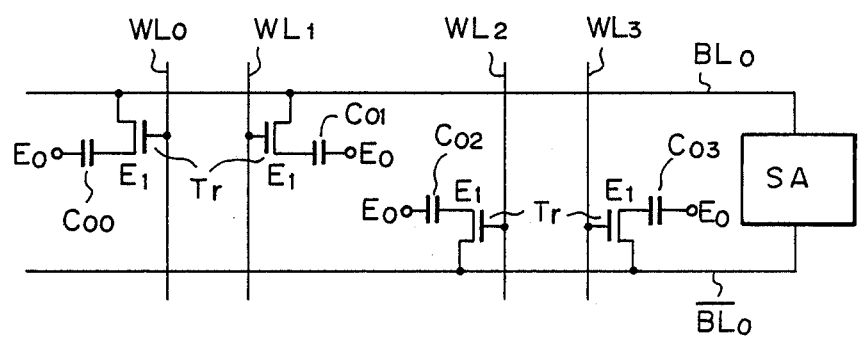
FIG. 3 is an equivalent circuit diagram of the device shown in FIGS. 1 and 2.

Generally, in a dynamic-type memory-cell configuration, two types of systems are known. One is the folded bit-line and the other is the open bit-line type. The latter will be explained later. The former has a pair of bit lines $BL_0$ and $\overline{BL_0}$, as shown in FIG. 3, arranged in parallel with each other. Specifically, the bit line $BL_0$ is folded through a sense amplifier (SA). The folded bit-line type memory device has a higher immunity to noise than the open bit-line type, because the voltage difference between the bit lines $BL_0$ and $\overline{BL_0}$ is not affected by the noise voltage.

In FIG. 3, reference Tr designates a transfer transistor, $C_{00}$ to $C_{03}$ capacitors, $E_0$ and $E_1$ electrodes for each capacitor, and $WL_0$ to $WL_3$ word lines. Each memory cell consists of a capacitor and transfer transistor and is arranged at an intersection defined by the bit line $BL_0$ and the word line WL.

In FIGS. 1 and 2, the folded bit-line type semiconductor memory device includes a p-type silicon substrate 1, a field silicon oxide film 2, an n+-type diffusion region 3a functioning as a drain of the transfer transistor, and an n+-type diffusion region 4a functioning as a source of the transfer transistor. The semiconductor memory device also includes gate oxide layers 5-1a and 5-2a each being a gate of the transfer transistor, first to fourth word lines 6-1 to 6-4, formed as first conductive layers and made of, for example, polycrystalline silicon PA, and first insulating layers 7-1 to 7-4 covering the first conductive layers. The semiconductor memory device further includes electrodes 8-1a and 8-2a for the capacitors, formed as second conductive layers and of, for example, polycrystalline silicon PB, second insulating films 9-1 and 9-2 of dielectric material, and electrode 10, formed as a third conductive layer and of polycrystalline silicon PC. In addition, the semiconductor memory device include the insulation film, a contact window 12a, and a bit line 13a of, for example, aluminum.

In FIG. 2, the second insulating films 9-1 and 9-2, disposed between the opposed second and third conductive layers 8-1a (8-2a) and 10, both functioning as electrodes, function as the capacitors C. Note that the capacitors are formed in vacant spaces which extend above the adjoining word lines, in a stack form, and have a considerably large area. This large area ensures a considerably large capacitance when the semiconductor memory device is highly integrated, which avoids reduction of the gate length of the transfer transistor. This increases the immunity to soft errors due to alpha ($\alpha$) rays and harmful effects due to hot electrons and hot holes.

The semiconductor memory device, however, still suffers from the following disadvantages.

The connection of the bit line 13a with the second n+-type diffusion region 4a, which acts as the source of the transfer transistor when the read operation is effected or the drain of the transfer transistor when the write operation is effected, is achieved by means of the contact window 12a. The contact window 12a is formed on the diffusion region 4a by the mask aligning with the fourth insulating layer 11. In other words, the contact window 12a must be apertured at a portion between the word lines 6-1 and 6-2. In this regard, a positional space margin of the mask alignment must be considered.

In addition, to prevent the connection between the bit line 13a and the word lines 6-1 and/or 6-2 by inadvertent removal of the layer insulation film 11 and the first insulating layer 7-1 and 7-2 adjacent to corners of the word lines 6-1 and 6-2 during etching, etc., the distance $D_1$ between the adjoining word lines 6-1 and 6-2 formed by polycrystalline silicon layer PA must further be increased. Naturally, the length of the diffusion region 4a must be increased. As is clearly understood from the discussion set forth above, this interferes with high integration.

Further, the contact window 12a is deep. This tends to form a large step around the window, which increases the probability of breakage of the bit line 13a. The aforementioned Japanese Unexamined patent publication No. 55-154762 discloses a stacked type memory cell device in which a polycrystalline silicon pad is formed within the bit line contact area under the bit line to lessen the step around the contact window. This alleviates the problem of bit line breakage due to the step.

However, this memory cell structure is not effective to reduce the marginal distance for preventing inadvertent short-circuits between the bit line 12a and the word lines 6-1 and 6-2 around the contact window.

An embodiment of the semiconductor memory device in accordance with the present invention will now be explained.

Figure 4:
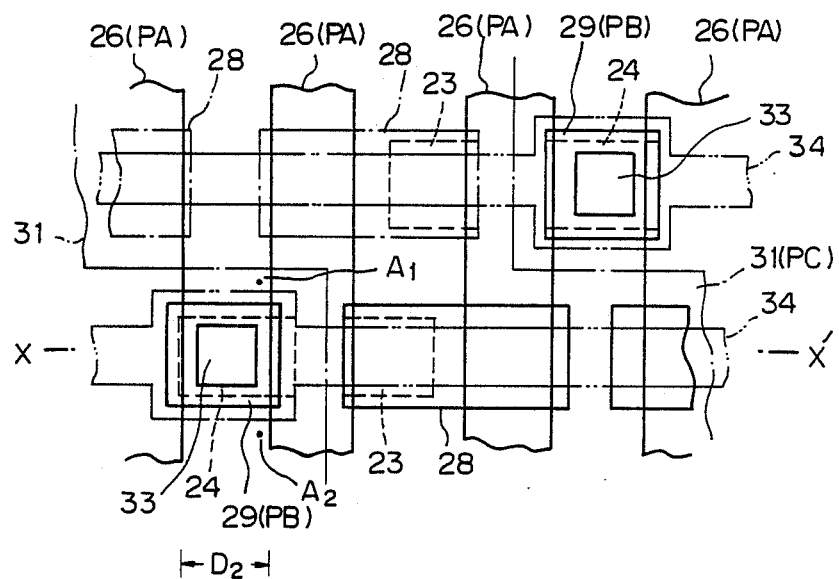
FIG. 4 is a plane view of an embodiment of a semiconductor memory device having stacked-capacitor type memory cells in accordance with the present invention.
Figure 5:
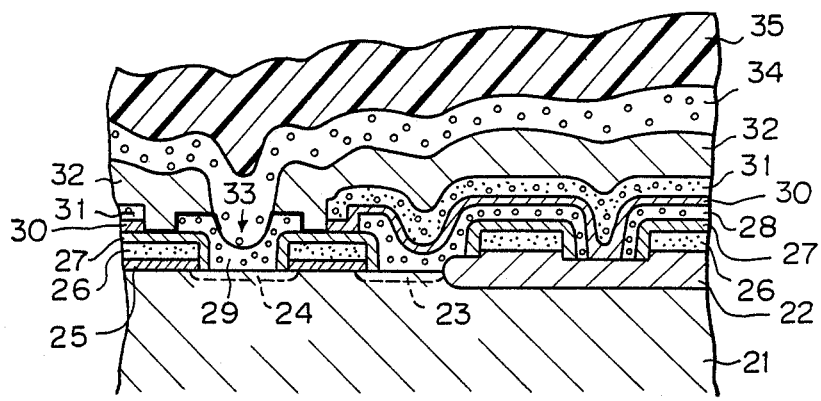
FIG. 5 is a sectional view of the semiconductor memory device shown in FIG. 4, taken along the line X—X' in FIG. 4.

FIG. 4 is a plane view of the embodiment of the semiconductor memory device. FIG. 5 is a sectional view of the semiconductor memory device, taken along a line X—X' shown in FIG. 4. The semiconductor memory device is also a stacked-capacitor and folded bit-line type semiconductor memory device, as shown by the equivalent circuit in FIG. 3.

In FIGS. 4 and 5, the semiconductor memory device includes a p-type silicon substrate 21, a field silicon oxide film 22, an n+-type diffusion region 23, an n+-type diffusion region 24, and a gate oxide layer 25 having a normal thickness. The diffusion regions 23 and 24 and the gate oxide layer 25 form a transfer transistor Tr.

The semiconductor memory device also includes a first conductive layer 26 having an n+-type conductivity, made of polycrystalline silicon layer PA of approximately 4000Å to 5000Å thickness and functioning as a word line and also as a gate electrode of the transfer transistor with the cell area, and a first insulating film 27 covering each word line 26 and being of silicon oxide ($SiO_2$) or silicon nitride ($Si_3O_4$), of approximately 2000Å thickness.

The semiconductor memory device includes a second conductive layer 28 having an n+-type conductivity, of approximately 2000Å thickness of polycrystalline silicon PB, directly connected to the diffusion region 23, and functioning as one electrode for a capacitor, a second insulating film 30 of silicon oxide or silicon nitride of approximately 200 to 300Å and functioning as a dielectric film for forming a capacitor, and a third conductive layer 31 having an n+-type conductivity, of approximately 2000Å thickness of polycrystalline silicon PC and functioning as another electrode for the capacitor. Capacitor means consisting of the electrodes 28 and 31 and the capacitive element 30 is arranged above the surface of the substrate in a stacked form.

Other capacitor means can be further stacked, if required. The construction mentioned above substantially conforms to that in the prior art shown in FIGS. 1 and 2.

The semiconductor memory device further includes an island-form conductive layer 29. The island-form conductive layer 29 is made of a polycrystalline silicon layer formed simultaneously with the second conductive layer 28 through a common deposition and patterning process. Accordingly, the layer 29 is of approximately 2000Å thickness. The island-form conductive layer 29, on one hand, is directly connected to the diffusion region 24 and, on other hand, extends over the word lines 26 with the first insulating films 27 interposed therebetween. Reference 33 designates a contact window.

In FIG. 5, the island-form conductive layer 29 may be formed separately of the second conductive layer 28. It may, however, advantageously be formed with the second conductive layer 28, namely in the same process for forming the second conductive layer 28, as will be explained later.

The semiconductor memory device includes a layer insulation film 32 of, for example, phosphosilicate glass (PSG) of approximately 6000Å to 10000Å thickness, a bit line 34 of, for example aluminum, and a protective layer 35 of, for example, phosphosilicate glass.

The bit line 34 directly contacts the island-form conductive layer 29 at the contact window 33, and thus comes into electric contact with the diffusion region 24 indirectly.

The manufacturing method of the semiconductor memory device shown in FIGS. 4 and 5 will now be explained with reference to FIGS. 6a to 6i and FIGS. 7a to 7c.

In FIG. 6a, first, the field silicon oxide layer 22 is formed on a p⁻-type silicon semiconductor substrate 21 having a predetermined specific resistance by a normal selective oxidation process to expose a transfer transistor forming region 41. Next, the gate oxide layer 25 is formed on the transfer transistor forming region 41 by a thermal oxidation process. The thickness of the gate oxide layer 25 is approximately 400Å to 500Å.

In FIG. 6b, first, the first polycrystalline silicon layer (PA) 26, of about 4000Å to 5000Å thickness is formed on the above substrate by a normal chemical vapor deposition (CVD) process. Next, the n-type impurity substance is introduced into the polycrystalline silicon layer 26 by, for example, an ion implantation process, to give the polycrystalline silicon layer 26 an n⁺-type conductivity. After that, the layer 27 of silicon oxide or silicon nitride, which is about 2000Å in thickness and may be a part of the first insulating layer, is formed on the polycrystalline silicon layer 26 by, for example, the CVD process. In addition, by applying normal patterning, the word lines 26-1 to 26-4, on which the first insulating layers 27-1 to 27-4 are deposited, respectively, are formed. Most of the gate oxide layer 25 is removed by an etching process, the portions of the gate oxide layer 25 under the word lines 26-1 to 26-2 being protected from etching. Thus, the diffusion-region forming surfaces 42-1 and 42-2 are exposed.

In FIG. 6c, a silicon oxide layer or silicon nitride layer of about 2000Å thickness is formed on portions from which the first insulating layer 27 was removed at the preceding process so as to form a single first insulating layer 27 fully covering the substrate.

In FIG. 6d, again, the first insulating layer 27 is etched by, for example, a reactive ion etching process which has an anisotropic etching effect in the vertical direction with respect to the substrate plane, to reexpose the surfaces 42-1 and 42-2. At this stage, the first insulating layers 27-1 to 27-4, each about 2000Å in thickness and covering the respective word lines 26-1 to 26-4, remain.

Next, masking the word lines 26-1 to 26-4 which are covered by the first insulating layers 27-1 to 27-4, respectively, and the field oxide layer 22, the n-type impurity is selectively ion-injected into the diffusion-region forming surfaces 42-1 and 42-2. As a result, an n⁺-type diffusion region 23 for a source and an n⁺-type diffusion region 24 for a drain are formed.

In FIG. 6e, a second conductive layer 28 of polycrystalline silicon (PB) of about 2000Å thickness is formed on the substrate shown in FIG. 6d by the CVD process and then is ion-injected with the n-type impurity to make it conductive. Note that a portion which may act as an island-form conductive layer (region) 29 is formed simultaneously with the conductive layer 28 by the above CVD process.

Next, the polycrystalline silicon layer (PB) 28 is patterned to form the electrodes 28-1 and 28-2 for the capacitors C₂ and C₃ shown in FIG. 5, which, on one hand, directly contact the first diffusion region 23 etc. and, on the other hand, extend over the adjacent word lines 26-2 and 26-3 via the first insulating layers 27-2 and 27-3, and to form the island-form conductive layer 29, which, on one hand, directly contacts the second diffusion region 24 and, on the other hand, faces the adjacent word lines 26-1 and 26-2 through the first insulating layers 27-1 and 27-2 enclosing the word lines 26-1 and 26-2. Note that the island-form conductive layer 29 extends over the adjacent word lines 26-1 and 26-2. This facilitates self-alignment for forming the contact window 33 in the following process after the layer insulation film 32 and the second insulating layer 30 are formed.

The second insulating layer 30 of silicon oxide or silicon nitride of about 200Å thickness and functioning as a dielectric film is formed on the capacitor electrodes 28-1 and 28-2, the first insulating layers 27-1 and 27-2, and the island-form conductive layer 29.

In FIG. 6f, the polycrystalline silicon layer (PC) of, for example, 2000Å thickness is formed on the substrate shown in FIG. 6e by the CVD process. Next, the ion-implantation process is effected to give a conductive nature to the polycrystalline silicon layer (PC), thus forming the third conductive layer 31.

After that, to remove the portion of the third conductive layer 31 above the island-form conductive layer 29, as shown in FIG. 6f, and to form electrode 31-2 opposing the electrodes 28-1 and 28-2 through the second insulating layer 30 (FIG. 6g), the polycrystalline silicon layer 31 (PC) is selectively patterned. The patterning process will be explained in more detail with reference to FIGS. 7a to 7c.

Figure 7A:
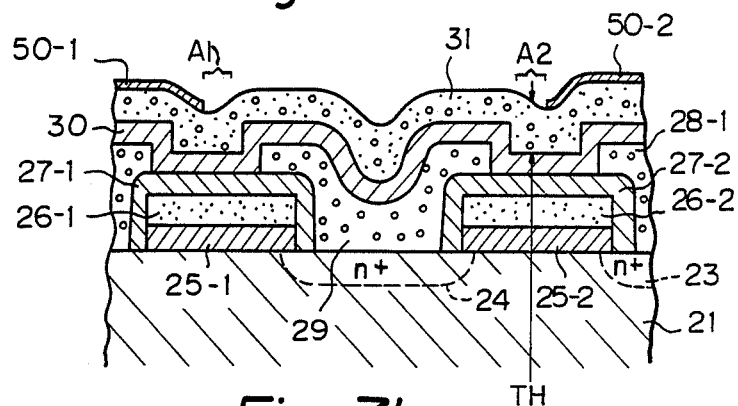
FIGS. 7a to 7c are enlarged sectional views explaining the manufacturing process of the semiconductor memory device shown in FIG. 5.
Figure 7B:
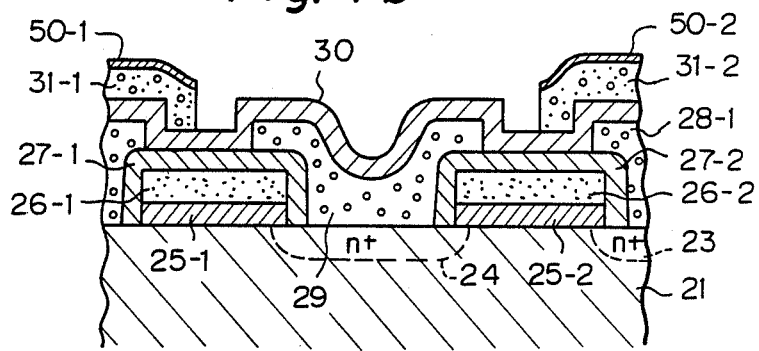
Figure 7C:
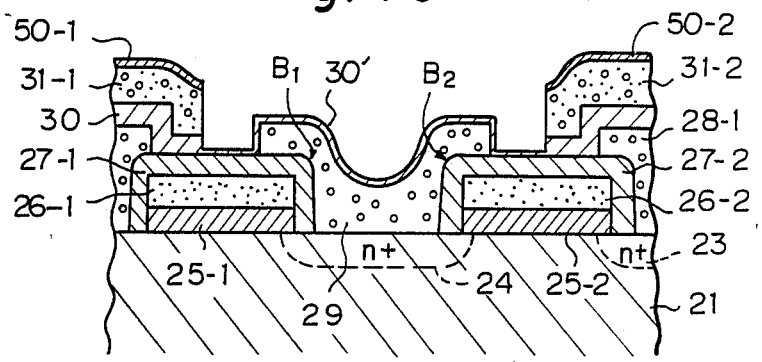

FIGS. 7a to 7c are enlarged sectional views of the island-form conductive layer 29 and adjacent regions thereof.

In FIG. 7a, masks 50-1 and 50-2 are placed on the third conductive layer 31 except above the island-form conductive region 29 and adjacent portions, for example, A₁ and A₂ in FIG. 4. After that, etching is effected, whereby the third conductive layer 31 of approximately 2000Å thickness above the island-form conductive region 29 is removed, as shown in FIG. 7b, exposing the surface of the second insulating layer 30 on the island-form conductive region 29. Approximately 2000Å of the portions of the third conductive layer 31 at the adjacent portions $A_1$ and $A_2$ is also removed simultaneously.

Note, however, that the thickness TH of the third conductive layer 31 at the adjacent portions $A_1$ and $A_2$ is larger than that above the island-form conductive region 29, because the former conductive layer is formed along the outer and vertical wall of the second insulating layer 27. It thus has a considerably large thickness, for example, approximately 6000Å to 7000 Å.

Accordingly, the etching process must be continued until the third conductive layer at the adjacent portions is fully removed. The removal of the third conductive layer is unavoidably accompanied by erosion of the second insulating layer 30 on the first insulating layers 27-1 and 27-2 and the island-form conductive region 29. Naturally, however, the speed of removal of the second insulating layer is much lower than that of the third conductive layer. Therefore, while the thickness of the second insulating layer is reduced as shown in FIG. 7c, in the etching process of the third conductive layer, the second insulating layer 30' on the island-form conductive region 29 remains in a small thickness. Thus, the island-form conductive region 29 and corners $B_1$ and $B_2$ of the first insulating layers 27-1 and 27-2 are not removed at all.

FIG. 6g is a sectional view of the semiconductor device at the time of completion of the above processes.

In FIG. 6h, a layer insulation film 32 of, for example, phosphosilicate glass of approximately 8000Å to 10000Å thickness is formed on the remaining portion of the third conductive layers 31-1 and 31-2, acting as the electrodes opposing the electrodes 28-1 and 28-2, by the CVD process. Next, a contact window 33, passing through the layer insulation film 32 and the remaining second insulating layer 30 to the island-form conductive region 29, is formed by a normal etching process. As a result, part of the island-form conductive region 29 is exposed.

In FIG. 6i, in accordance with the deposition process, the sputtering process, or the like, a layer of wiring material, for example, aluminum, is formed on the substrate. This is patterned in a normal manner to form a bit line 34 resistively connected to the second diffusion region 24, at the contact window 33, by way of the island-form conductive region 29.

Figure 8:
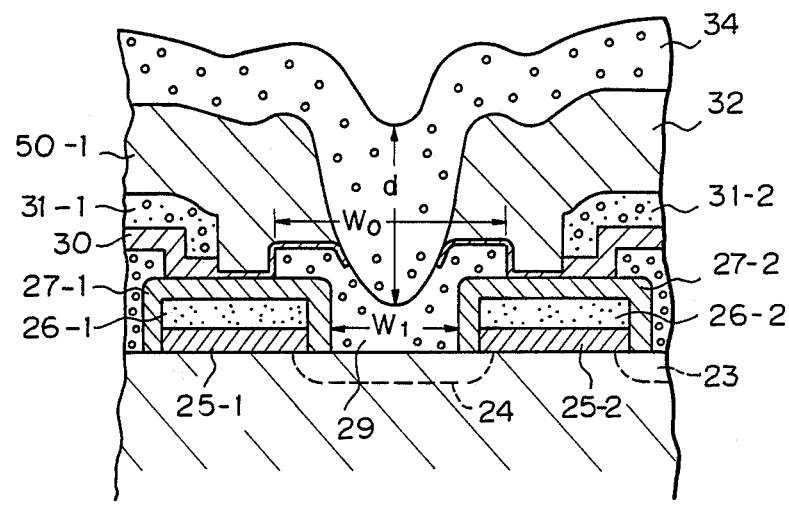
FIG. 8 is an enlarged view of the semiconductor memory device shown in FIG. 6i.

FIG. 8 is an enlarged sectional view of the semiconductor device after completion of the process mentioned above. Note, first, that there is essentially no possibility of connection between the bit line 34 and the word lines 26-1 and 26-2. Next, note that the distance $W_1$, i.e. $D_2$ in FIG. 4, between the adjoining word lines 26-1 and 26-2 can be reduced without detrimental effect on the connection between the bit line 34 and the second diffusion region 24 due to the island-form conductive region 29 extending on the first insulating layers 27-1 and 27-2 over the word lines 26-1 and 26-2 and having the width $W_0$. In other words, even if the distance between the adjoining first insulating layers 27-1 and 27-2 is a width $W_1$ somewhat shorter than just the length of the second diffusion region 24, the width $W_0$ in which the contact window 33 may be made is substantially equal to the distance defining the adjoining word lines in the prior art. This allows high integration of the semiconductor device without the need for other processes.

In addition, the depth d of the bit line 34 at the contact window is reduced due to the existence of the island-form conductive region 29. This decreases the possibility of disconnection of the bit line around the steps of the contact window edge.

Finally, the insulating layer for protection of the surface of the semiconductor device, of phosphosilicate glass or the like, is formed and the finishing process effected to produce the semiconductor device including the stacked-capacitor type memory cells as shown in FIG. 5.

In a semiconductor memory device comprising a plurality of stacked-capacitor type memory cells, wiring contact portions of sources and drains of transistors in peripheral circuits including sense amplifiers each consisting of transistors can be formed in the same construction as the above-mentioned memory cell portion. In this case, however, as the above island-form conductive layer overlaps the gate electrode, the capacitance of the gate of the transistors in the sense amplifier may increase and so the characteristic of the transistor would change. In order to avoid the above, the wiring contact portions in question are formed in a normal construction. The processes for manufacturing the peripheral circuits, more particularly the transistor portion, will be explained with reference to FIGS. 9a to 9g.

Figure 9A:
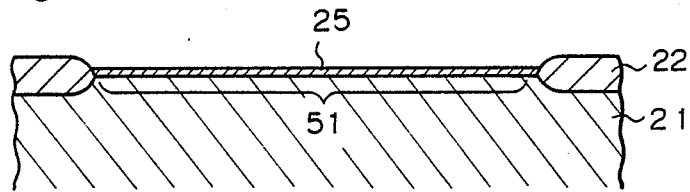
FIGS. 9a to 9f are sectional views explaining the production of other parts in the semiconductor memory device shown in FIG. 5.

In FIG. 9a, the field oxide film 22 is formed on the p-type silicon substrate 21, a transistor-forming region 51 is exposed simultaneously. The gate oxide layer 25 is also formed simultaneously. The process corresponds to that of FIG. 6a.

Figure 9B:
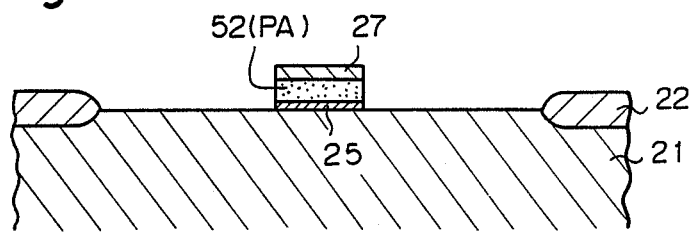

In FIG. 9b, the first polycrystalline silicon layer (PA) 52 is formed above the substrate. Then, the first polycrystalline silicon layer 52 is rendered electrically conductive by n-type impurity implantation. Part of the first insulating layer 27 is formed on the polycrystalline silicon layer 52. Next, patterning is applied to form the gate electrode, also referenced as 52, on which the first insulating film 27 is formed. The process corresponds to that of FIG. 6b.

Figure 9C:
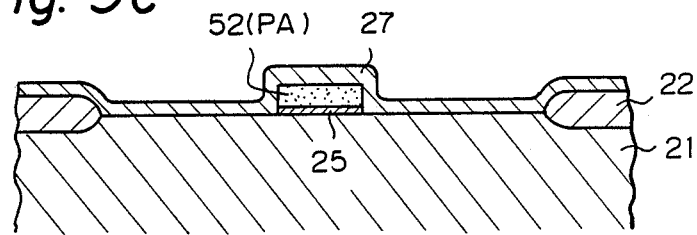

In FIG. 9c, the first insulating film 27 is again formed on the portions of the substrate 21 and the field oxide film 22 from which it was removed during the above patterning process. This process corresponds to that of FIG. 6c.

Figure 9D:
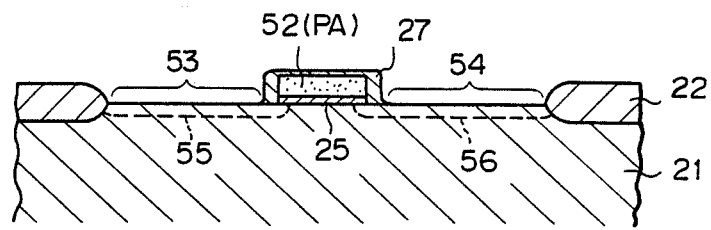

Subsequent to this, but before the process shown in FIG. 9d, various processes are effected. The first insulating film 27 arranged in the memory cell forming region is etched and ion-implantation performed, as in FIG. 6d. The peripheral regions are protected and remain as is (as shown in FIG. 9c).

Next, in the same process as shown in FIG. 6e, the second polycrystalline silicon layer (PB) 28 is deposited on the peripheral regions. However, the portion of the polycrystalline silicon layer deposited on the peripheral regions is fully removed during the patterning process. As a result, the peripheral regions are again made as shown in FIG. 9c.

Furthermore, during the same process as shown in FIG. 6f, the third conductive layer of polycrystalline silicon (PC) 31 is deposited on the peripheral regions. Again, however, the deposited polycrystalline silicon layer is completely removed during the subsequent patterning process. At this stage, the upper layer of the insulating layer 27 on the conductive layer 52 is also eroded, as mentioned above with reference to FIGS. 6g and 7a to 7c.

In FIG. 9d, prior to performing the process shown in FIG. 6h, the memory cell region is covered with a protective mask. Subsequently, the portions of the first insulating film 27 on the peripheral regions are entirely removed by the reactive ion-etching process, thus exposing transistor source- and drain-forming regions 53 and 54. The portion of the first insulating film 27 enclosing the gate electrode 52 remains. Furthermore, an n+-type impurity is ion-implanted into the source-and drain-forming regions 55 and 56, thereby forming n+-type source and drain regions 55 and 56.

Figure 9E:
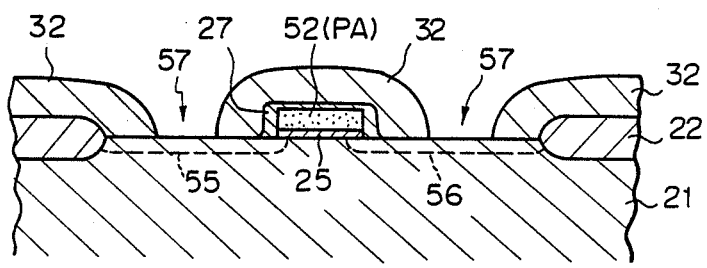

In FIG. 9e, during the process shown in FIG. 6h, the layer insulation film 32 of phosphosilicate glass is formed above the peripheral regions. Subsequently, contact windows 57 are formed in the source and drain regions 55 and 56.

Figure 9F:
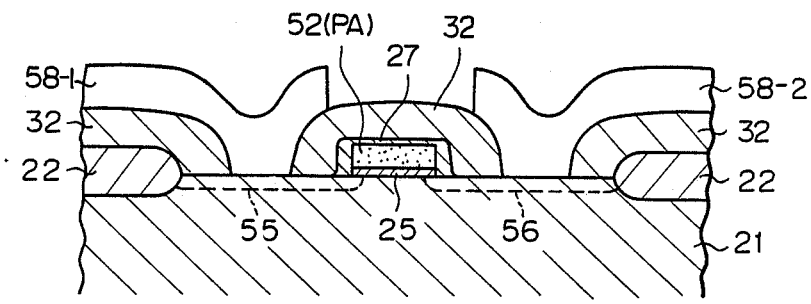

In FIG. 9f, during the process shown in FIG. 6i, a wiring layer 58 is formed on the layer insulation film 32 and the apertured portions of the source and drain regions 55 and 56. Next, the wiring layer 58 is separated above the first conductive layer 52 to form wiring layers 58-1 and 58-2.

After that, the memory cell regions, surface protecting insulating film, etc. are formed.

In the above embodiments, the first conductive layer, used for the word line or the gate electrode, and the second and third conductive layers, used for the capacitor electrodes, are made of polycrystalline silicon. These layers, however, particularly the first conductive layer, may also be made of high melting point metals, which can provide a low sheet resistance, or the like.

The first and second insulating films can be formed of thermal oxide films.

Figure 10A:
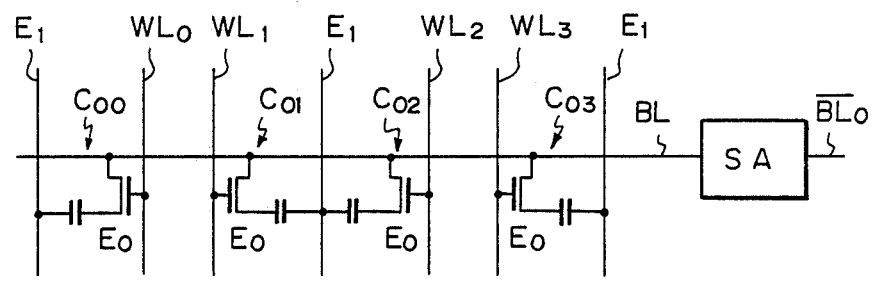
FIGS. 10a and 10b are an equivalent circuit diagram of an open bit-line type dynamic MOS memory device and a sectional view of a memory cell of another embodiment of the present invention.
Figure 10B:
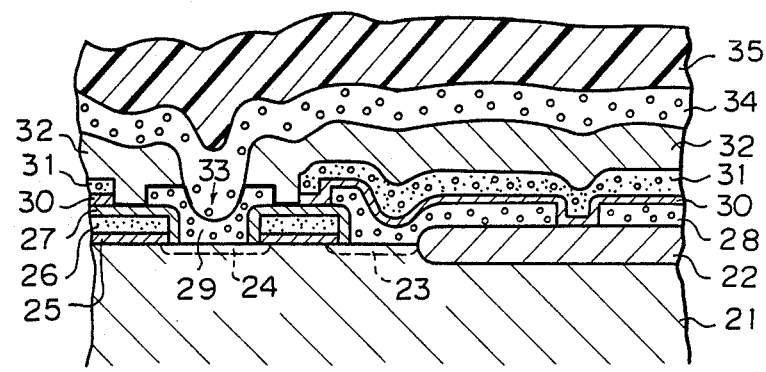

The present invention can also be applied to the open bit-line type stacked-capacitor memory cell, as shown by the equivalent circuit diagram in FIG. 10a and a sectional view of the unit memory cell device in FIG. 10b, in addition to the folded bit-line type stacked-capacitor memory cell discussed above. In FIGS. 10a and 10b, the same reference symbols as those in FIGS. 3 and 5 denote the same elements, respectively. The construction can easily be modified from the folded bit-line type to the open bit-line type by removal of the word line 26-3 in FIGS. 6b to 6i. Other processes are substantially identical to those mentioned before.

A modified process for manufacturing the folded bit-line type semiconductor memory device according to the present invention will be explained with reference to FIGS. 11a to 11c.

Figure 11A:
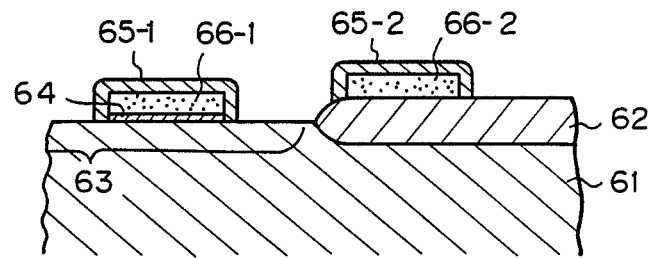
FIGS. 11a to 11c are sectional views explaining a part of the production of another embodiment of the semiconductor memory device in accordance with the present invention.

In FIG. 11a, a field oxide film 62 is formed on a substrate 61. An element-forming region 63 is formed on the surface of the substrate 61. In addition, a gate oxide layer 64 is formed. Gate electrodes 66-1 and 66-2 are formed, then insulating layers 65-1 and 65-2 of silicon oxide, each enclosing the gate electrode 66, are formed. The gate electrode 66-2 extends over the field oxide film 62 from an adjacent element-forming region.

Figure 11B:
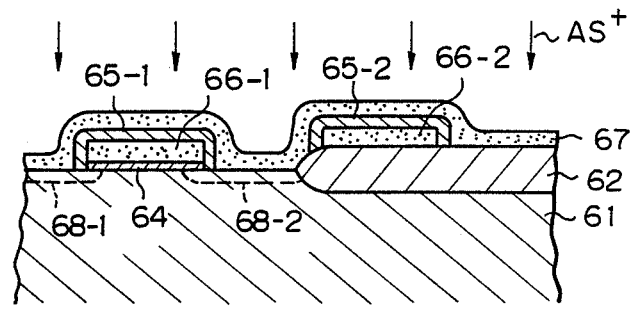

In FIG. 11b, a polycrystalline silicon layer 67 of approximately 2000Å thickness is formed above the substrate 61. Arsenic is ion-implanted into the polycrystalline silicon layer 67, then thermal treatment effected to form an n+-type source or drain region 68-1 and n+-type capacitor contact region 68-2. The polycrystalline silicon layer 67 is also rendered conductive. At the time, an island-form conductive portion is formed integrally with the polycrystalline layer.

This process step for forming source and drain regions 68-1 and 68-2 by introducing an impurity via the polycrystalline silicon layer 67 is the principal difference from the foregoing embodiment as in FIGS. 6a through 6i.

Figure 11C:
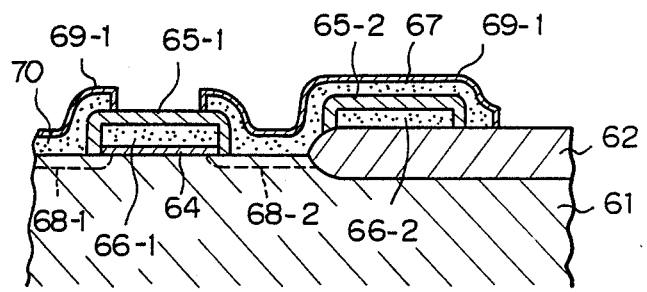

In FIG. 11c, patterning is performed to isolate the island-form conductive layer 70 and one capacitor electrode 67. The island-form conductive layer 70 extends over the gate electrode 66-1 through the insulating layer 65-1 and directly contacts the diffusion region 68-1. The capacitor electrode 67 extends above the gate electrode 66-1 to above the other gate electrode 66-2 and directly contacts the capacitor contact region 68-2. Dielectric films 69-1 and 69-2 of approximately 100Å thickness are formed on the island-form conductive layer 70 and the capacitor electrode 67 by the thermal oxide process.

The subsequent process are similar to those in FIGS. 6f to 6i.

Note that a P−-type semiconductor substrate is used in the above-mentioned embodiments. However, obviously, a N−-type substrate can be used.

Many widely different embodiments of the present invention may be constructed without departing form the spirit and scope of the present invention. It should be understood that the present invention is not limited to the specific embodiments described in this specification, except as defined in the appended claims.

We claim:

1. A semiconductor memory device comprising:
   a substrate;
   a plurality of word lines;
   a plurality of bit lines defining intersections with said word lines;
   a plurality of memory cells respectively positioned at said intersections, each said memory cell including a transfer transistor and a capacitor;
   said word lines being formed by a first conductive layer;
   said transfer transistor in each said memory cell comprising a gate connected to one of said word lines and formed by said first conductive layer, and source and drain regions;
   each of said memory cells having a first insulating layer covering said gate of said transfer transistor;
   said capacitor in each said memory cell comprising a second conductive layer which contacts, through said first insulating layer, a first one of said source and drain regions of said transfer transistor in one of said memory cells and extends onto said first insulating layer over a part of said gate of said transfer transistor, a second insulating layer formed on said second conductive layer, and a third conductive layer extending over said second insulating layer;
   each said memory cell having an additional conductive layer directly connected to said second one of said source and drain regions of said transfer transistor and extending over said gate of said transfer transistor on said first insulating film, and over said gate of an adjoining one of said transfer transistors of a respective adjoining one of said memory cells on said respective first insulating layer covering said gate of said adjoining transfer transistor, said additional conductive layer being formed in a layer having a respective part at each level of said second conductive layer;

a third insulating layer formed on said third conductive layer and having a contact hole formed therein, said contact hole exposing a portion of an upper surface of said additional conductive layer; and each said bit line being connected to said second one of said source and drain regions of each said respective memory cell through said additional conductive layer and including a fourth conductive layer formed on said third insulating layer and connected to said additional conductive layer through said contact role.

2. A semiconductor memory device according to claim 1, wherein said additional conductive layer has a predetermined thickness at its portions where it extends over said gates and a predetermined width to ensure forming a contact window for electrically connecting the respective bit line with said second one of said source and drain regions via the additional conductive layer.

3. A semiconductor memory device according to claim 2, wherein the thickness of the additional conductive layer is approximately equal to that of the second conductive layer.

4. A semiconductor memory device according to claim 1, wherein said word lines are covered by said first insulating layer of the respective memory cells to electrically isolate each of said word lines from each respective bit line and each said second conductive layer.

5. A semiconductor memory device according to claim 1, wherein said second conductive layer in each same memory cell extends over one of the word lines of an adjacent one of said memory cells.

6. A semiconductor memory device according to claim 1, wherein said second one of said source and drain regions of respective adjacent pairs of said memory cells are provided in common, said additional conductive layer is provided in common with respect to said commonly supplied second one of said source and drain regions for each respective adjacent pairs of memory cells, and to extend over both said gates of said respective pair of adjacent memory cells in a manner so as to prevent the respective bit line connected to said commonly provided additional conducting layer from contacting any part of said first insulating layer on the respective gates.

7. A memory device according to claim 6, wherein said third conductive layer extends in common to all said memory cells, and has a respective portion extending over said part of each said gate, on the corresponding part of said first 8. A memory device according to claim 6, wherein said second insulating layer extends in contact with said first insulating layer on said gate of the same memory cell under said respective portion of said third conductive layer of the respective memory cell, so that said third conductive layer does not contact said first insulating layer over said gate.

9. A semiconductor memory device comprising:
a substrate;
a plurality of word lines formed by a first conductive layer;
a plurality of bit lines intersecting said word lines;
a plurality of memory cells respectively positioned at the intersections of said word lines and said bit lines, each of said memory cells including:
a first insulating layer;
a transfer transistor having a gate connected to one of said word lines and formed by said first conductive layer, having a source region and having a drain region, said first insulating layer covering said gate of said transfer transistor; and
a capacitor including:
a second conductive layer contacting, through said first insulating layer, a first one of said source and drain regions of a respective transfer transistor in a respective one of said memory cells and extending onto said first insulating layer over a portion of said gate of said transfer transistor;
a second insulating layer formed on said second conductive layer; and
a third conductive layer extending over said second insulating layer;
an additional conductive layer directly connected to a second one of said source and drain regions of said respective transfer transistor and extending over said gate of said respective transfer transistor and over a gate of an adjoining one of said transfer transistors, said additional conductive layer being formed in a layer having a respective portion at each level of said second conductive layer,
each said bit line being connected to said second one of said source and drain regions of said respective transfer transistor through said additional conductive layer; and
a peripheral circuit including:
wiring lines;
transistors connected to said wiring lines, each of said transistors having source and drain regions directly connected to said wiring lines, and having a gate electrode; and
a third insulating layer entirely covering said gate electrodes, said third insulating layer being thicker than said first insulating layer, for reducing capacitance between said gate electrodes of said transistors and said wiring lines.

* * * * *

UNITED STATES PATENT AND TRADEMARK OFFICE
CERTIFICATE OF CORRECTION

PATENT NO. : 4,754,313
DATED : JUNE 28, 1988
INVENTOR(S) : YOSHIHIRO TAKEMAE ET AL.

It is certified that error appears in the above-identified patent and that said Letters Patent is hereby corrected as shown below:

Col. 3, line 13, "$BL_0$" should be --$\overline{BL_0}$--; (2nd occurrence)

line 14, "$\overline{BL_0}$" should be --$\overline{BL_0}$--;

line 18, "$\overline{BL_0}$" (second occurrence) should be --$\overline{BL_0}$--.

Signed and Sealed this

First Day of November, 1988

*Attest:*

DONALD J. QUIGG

*Attesting Officer*  *Commissioner of Patents and Trademarks*